United States Patent
Matsumaru et al.

(10) Patent No.: US 7,932,013 B2
(45) Date of Patent: Apr. 26, 2011

(54) PATTERN COATING MATERIAL AND PATTERN FORMING METHOD

(75) Inventors: Shogo Matsumaru, Kawasaki (JP); Toshiyuki Ogata, Kawasaki (JP); Kiyoshi Ishikawa, Kawasaki (JP); Hideo Hada, Kawasaki (JP); Shigenori Fujikawa, Fujimi (JP); Toyoki Kunitake, Kasuya-gun (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 485 days.

(21) Appl. No.: 11/993,444

(22) PCT Filed: Jun. 16, 2006

(86) PCT No.: PCT/JP2006/312136
§ 371 (c)(1),
(2), (4) Date: Dec. 20, 2007

(87) PCT Pub. No.: WO2006/137342
PCT Pub. Date: Dec. 28, 2006

(65) Prior Publication Data
US 2009/0029284 A1    Jan. 29, 2009

(30) Foreign Application Priority Data
Jun. 24, 2005   (JP) .............................. P2005-184674

(51) Int. Cl.
G03F 7/004    (2006.01)
G03F 7/30     (2006.01)

(52) U.S. Cl. ................ 430/270.1; 430/271.1; 430/291; 430/317

(58) Field of Classification Search .................. 430/291, 430/317, 323, 324, 270.1, 271.1
See application file for complete search history.

(56) References Cited

U.S. PATENT DOCUMENTS

| | | | | |
|---|---|---|---|---|
| 3,873,341 | A | * | 3/1975 | Janus .............................. 430/296 |
| 5,094,936 | A | * | 3/1992 | Misium et al. ................. 430/325 |
| 5,116,715 | A | * | 5/1992 | Roland et al. .................. 430/190 |
| 5,123,998 | A | * | 6/1992 | Kishimura ....................... 216/48 |
| 5,217,851 | A | * | 6/1993 | Kishimura et al. ........... 430/325 |
| 6,461,533 | B1 | | 10/2002 | Horiike et al. |
| 6,534,235 | B1 | * | 3/2003 | Hanabata et al. ............. 430/191 |
| 7,297,466 | B2 | * | 11/2007 | Lee et al. ....................... 430/291 |
| 2004/0058270 | A1 | | 3/2004 | Iwai et al. |

FOREIGN PATENT DOCUMENTS

| | | |
|---|---|---|
| JP | 63-5530 | 1/1988 |
| JP | 11-111680 | 4/1999 |
| JP | 2003-167346 | 6/2003 |

OTHER PUBLICATIONS

International Search Report in connection with corresponding PCT application No. PCT/JP2006/312136, dated Sep. 12, 2006.

* cited by examiner

*Primary Examiner* — John S Chu
(74) *Attorney, Agent, or Firm* — Knobbe, Martens, Olson & Bear LLP

(57) ABSTRACT

There are provided a coating material which improves an etching resistance of a pattern in an etching process using a pattern formed on a substrate as a mask.
The material is a pattern coating material for an etching process using a pattern formed on a substrate as a mask, including a metal compound (W) which can produce a hydroxyl group on hydrolysis.

7 Claims, 1 Drawing Sheet

US 7,932,013 B2

PATTERN COATING MATERIAL AND PATTERN FORMING METHOD

RELATED APPLICATIONS

This application is the U.S. National Phase filing under 35 U.S.C. §371 of PCT/JP2006/312136, filed Jun. 16, 2006, which designated the United States and was published in a language other than English, which claims priority under 35 U.S.C. §119(a)-(d) to Japanese Patent Application No. 2005-184674 filed Jun. 24, 2005. The content of these applications is incorporated herein by reference in their entireties.

TECHNICAL FIELD

The present invention relates to a pattern coating material and a pattern forming method.

BACKGROUND ART

The technology to process a lower layer under a pattern, by forming a fine pattern on a substrate and performing an etching using the formed pattern as a mask, is adopted for producing an integrated circuit (IC) and the like in the semiconductor industry, and thus it has received great attention. This fine pattern is composed of an organic material, and is formed by using technologies such as photolithographic methods and nano-imprinting methods.

For example, in a photolithographic method, the pattern is formed by using a resist composition containing a resin component. There are two types of resist compositions, that is, a positive resist composition and a negative resist composition.

A coating film composed of a positive resist composition has the property that it is insoluble in an alkali developer before exposure, and changes to be soluble after exposure. A coating film composed of a negative resist composition has the property that it is soluble in an alkali developer before exposure, and changes to be insoluble after exposure.

For example, when a pattern is formed by using a positive resist composition, the positive resist composition is applied and dried, thereby forming a coating film. Next, the coating film is exposed through a mask pattern, and developed using an alkali developer, thereby removing an exposed portion, which is changed to be soluble in the alkali developer. As a result, a pattern is obtained.

Then, using the pattern as a mask, a substrate and the like are processed by etching. As the etching, wet etching or dry etching is used, and of these, dry etching is mainly used (for example, see Patent Document 1).

Patent Document 1

Japanese Unexamined Patent Application, First Publication No. 2003-167346

DISCLOSURE OF THE INVENTION

Problems to be Solved by the Invention

However, a pattern formed by using an organic material such as a resist composition and a nano-imprinting material has low etching resistance, therefore it is required to improve the property as a mask in an etching process.

The present invention takes the above circumstances into consideration, with an object of improving etching resistance of a pattern, in an etching process in which a pattern formed on a substrate is used as a mask.

Means for Solving the Problems

To achieve the above object, the present invention employs the following constitutions.

A first aspect of the present invention represents a pattern coating material which is used in an etching process in which a pattern formed on a substrate is used as a mask, the pattern coating material including a metal compound (W) which can produce a hydroxyl group through hydrolysis.

A second aspect of the present invention represents a resist pattern forming method, which includes forming a pattern on a laminate which is equipped with a substrate and an organic film, coating the pattern by using the pattern coating material according to the first aspect of the present invention, and conducting an etching of the organic film using the coated pattern as a mask.

Effects of the Invention

The present invention enables etching resistance of a pattern to be improved in an etching process using a pattern formed on a substrate as a mask.

DESCRIPTION OF THE REFERENCE NUMERALS

Figure 1A:
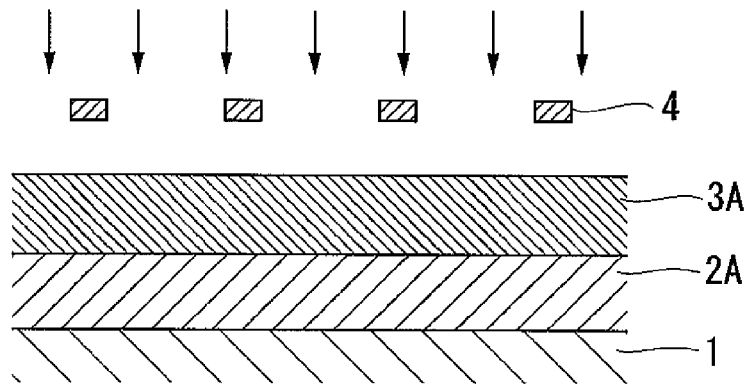
FIG. 1A is an explanatory drawing which shows an example of the procedure of a pattern forming method using a pattern coating material of the present invention.

1 . . . substrate
2A . . . organic film
3A . . . resist film
4 . . . mask
2B . . . organic film pattern
3B . . . resist pattern
5 . . . coating layer

BEST MODE FOR CARRYING OUT THE INVENTION

Pattern Coating Material

A pattern coating material in the present invention contains a metal compound (W) which can produce a hydroxyl group through hydrolysis.

When a pattern coating material having the metal compound (W) is applied on a pattern, and brought into contact with water, preferably with deionized water, the metal compound (W) undergoes hydrolysis and produces a hydroxyl group, thereby forming a coating film containing a metal oxide with excellent etching resistance.

As the metal compound (W), any metal compound having a functional group which can produce a hydroxyl group through hydrolysis can be used without limitation.

It is preferable that the functional groups is directly connected with a metal atom.

Also, the number of functional group is preferably 2 or more per metal atom, more preferably from 2 to 4 per metal atom, and still more preferably 4 per metal atom. When a metal compound has 2 or more functional groups per metal atom, the hydroxyl groups formed through hydrolysis are condensed, and a plurality of the metal compound (W) molecules are connected with one another, thereby forming a metal oxide film with high film-density and high rigidness.

Examples of the functional groups include alkoxy groups, isocyanate groups and carbonyl groups. Also, halogen atoms are included in the functional groups in the present invention, because they have the same function.

Examples of alkoxy groups include linear or branched lower alkoxy groups of 1 to 5 carbon atoms, such as methoxy groups (—O-Me), ethoxy groups (—O-Et), n-propoxy groups (—O-nPr), isopropoxy groups (—O-iPr) and n-butoxy groups (—O-nBu).

Examples of halogen atoms include chlorine atoms, fluorine atoms, bromine atoms and iodine atoms. Of these, chlorine atoms are preferable.

In the examples described above, alkoxy groups and isocyanate groups are particularly preferable, because they conduct the condensation reaction with reaction groups such as carboxyl groups and hydroxyl groups, when the reaction groups are on the surface of a pattern. Thereby, hydroxyl groups formed after hydrolysis and reaction groups on the surface of a pattern conduct a condensation reaction, and a coating layer adheres tightly to the surface of a pattern.

Of the examples described above, carbonyl groups and halogen atoms are particularly preferable, because carbonyl groups and halogen atoms adsorb to reaction groups such as carboxyl groups and hydroxyl groups, when the reaction groups are on the surface of a pattern. Thereby, hydroxyl groups formed after hydrolysis adsorb to the reaction groups on the surface of a pattern, and a coating layer adheres tightly to the surface of a pattern.

Of these, isocyanate groups and halogen atoms (particularly chlorine atoms) are preferable, and isocyanate groups are more preferable, because a metal oxide film with high activity can be formed easily without heat treatment.

A metal compound (W) may have atoms and organic groups other than "a functional group which can produce a hydroxyl group through hydrolysis" described above. Examples of the atoms include hydrogen atom. Examples of the organic groups include alkyl groups (preferably lower alkyl groups of 1 to 5 carbon atoms), and ethyl groups and methyl groups are preferable.

In the present invention, as examples of a metal which constitutes the metal compound (W), boron, silicon, germanium, antimony, selenium and tellurium are also included, in addition to general metals. Suitable examples of a metal which constitutes the metal compound (W) include titanium, zirconium, aluminum, niobium, silicon, boron, lanthanide, yttrium, barium, cobalt, iron and tantalum. Of these, titanium and silicon are preferable, and silicon is particularly preferable.

The number of metal atoms in the metal compound (W) may be one, or two or more, and preferably the number is one.

Examples of metal compounds (W) include those described below.

Examples of metal compounds having alkoxy groups (hereinafter sometimes referred to as "metal alkoxide compounds") include:

metal alkoxide compounds other than rare-earth metals, such as titanium butoxide (Ti(O-nBu)$_4$), zirconium propoxide (Zr(O-nPr)$_4$), aluminum butoxide Al(O-nBu)$_3$), niobium butoxide (Nb(O-nBu)$_5$), silicon tetramethoxide (Si(O-Me)$_4$) and boron ethoxide (B(O-Et)$_3$);

metal alkoxide compounds of rare-earth metals, such as lanthanide isopropoxide (Ln(O-iPr)$_3$) and yttrium isopropoxide (Y(O-iPr)$_3$);

double alkoxide compounds, such as barium titanium alkoxide (BaTi(OR$^{60}$)$_x$) (wherein, "R$^{60}$" represents lower alkyl groups of 1 to 5 carbon atoms; and X represents an integer from 2 to 4);

metal alkoxide compounds containing at least two alkoxyl groups and an organic group other than alkoxy groups, such as methyltrimethoxysilane (MeSi(O-Me)$_3$) and diethyldiethoxysilane Et$_2$Si(O-Et)$_2$); and metal alkoxide compounds having a ligand such as acetylacetone and two or more alkoxy groups.

Further, fine particles of alkoxide sols or alkoxide gels obtained by adding a small quantity of water to an aforementioned metal alkoxide to cause partial hydrolysis and condensation can be used.

Furthermore, dimers or cluster-type alkoxide compounds containing either a plurality of one metal element or a plurality of different metal elements, such as titanium butoxide tetramer (C$_4$H$_9$O[Ti(OC$_4$H$_9$)$_2$O]$_4$C$_4$H$_9$), and polymers based on metal alkoxide compounds with one dimensional crosslinking via an oxygen atom are also included in the above metal alkoxide groups.

Examples of metal compounds containing isocyanate groups include compounds containing two or more isocyanate groups represented by the general formula "M(NCO)x" (wherein, M represents a metal atom; and X represent an integer from 2 to 4 in the formula).

Specific examples thereof include tetraisocyanate silane (Si(NCO)$_4$), titanium tetraisocyanate (Ti(CO)$_4$), zirconium tetraisocyanate (Zr(NCO)$_4$), and aluminum triisocyanate (Al(NCO)$_3$).

Examples of metal compounds with halogen atoms include halogenated metal compounds containing two or more halogen atoms (preferably from 2 to 4) represented by the general formula "M(X$_1$)n" (herein, M represents a metal atom; X$_1$ represents one selected from a fluorine atom, a chlorine atom, a bromine atom and an iodine atom; and n represents an integer from 2 to 4).

A compound containing halogen atoms may be a metal complex.

Specific examples thereof include tetrachlorotitanium (TiCl$_4$) and tetrachlorosilane (SiCl$_4$). Also, examples of a metal complex include cobalt chloride (CoCl$_2$).

Specific examples of metal compounds with carbonyl groups include metal carbonyl compounds such as titanium oxoacetylacetate (TiO(CH$_3$COCH$_2$COO)$_2$), and iron pentacarbonyl (Fe(CO)$_5$), and polynuclear clusters thereof.

Of these, silicon compounds with two or more (preferably from 2 to 4) isocyanate groups and/or halogen atoms are particularly preferable, because they have high activity, and can conveniently form metal oxide films with high etching resistance, without heat treatment. The number of silicons in a molecule may be one, or two or more. Preferably the number is one.

Of these, compounds represented by the general formula (S-1) shown below are preferable.

$$SiW_a \quad \text{(S-1)}$$

(wherein, a represents an integer from 2 to 4; W represents an isocyanate group (NCO group) or a halogen atom; and W may be either the same or different mutually.)

In the formula, a represents an integer from 2 to 4, and is preferably 4. W represents an isocyanate group or a halogen atom. The halogen atoms are same as those described above, and of these, a chlorine atom is preferable. As W, an isocyanate group is preferable.

The metal compounds (W) can be used either alone, or in combinations of two or more different compounds.

In addition to the metal compounds (W), organic compounds can also be added to pattern coating materials. This enables a complex film containing metal oxides and organic compounds to be formed.

As organic compounds, any organic compound which can be soluble in a solvent used for pattern coating materials described below can be used without limitation. The term "soluble" here is used not only in the case that the organic compounds are themselves soluble in the solvent, but also in the case that compounds, such as 4-phenylazobenzoic acid, become soluble in the solvent such as chloroform by complexing with the metal alkoxide. There are no limitation on the molecular weight of the organic compounds.

As organic compounds, preferable are organic compounds which have a plurality of reaction groups (preferably hydroxyl groups or carboxy groups) and are solid at room temperature (25° C.), from the viewpoint of enabling more rigid contact with the pattern.

Specific examples of preferred organic compounds that satisfy these requirements include polymer compounds containing hydroxyl groups or carboxyl groups such as polyacrylic acid, polyvinyl alcohol, polyvinylphenol, polymethacrylic acid and polyglutamic acid; polysaccharides such as starch, glycogen and colominic acid; disaccharides or monosaccharides such as glucose and mannose; and porphyrin compounds or dendrimers containing hydroxyl groups or carboxyl groups at the terminals.

Further, cationic polymer compounds can also be preferably used as organic compounds. Because metal alkoxides and metal oxides can form anionic interaction with the cations of such cationic polymer compounds, powerful bonding can be achieved.

Examples of cationic polymer compounds include PDDA (polydimethyldiallylammonium chloride), polyethyleneimine, polylysine, chitosan, and dendrimers containing amino groups at the terminals.

These organic compounds function as structural elements to form thin films with high mechanical strength. Also, the organic compounds can play a role as functional sites to give some sort of function to thin film materials obtained, or as components to form vacancies in thin films according to the molecular shape by removing the organic compounds after forming films.

The organic compounds can be used alone, or in combinations of two or more different compounds. If organic compounds are used, the quantity of the organic compounds are within a range from 0.1 to 50 parts by mass, and preferably from 1 to 20 parts by mass, relative to 100 parts by mass of the metal compounds (W).

In the pattern coating materials of the present invention, it is preferable that the metal compounds (W) and the organic compounds, which are added according to need, are used as a liquid solution dissolved in appropriate solvents.

Examples of the solvents include methanol, ethanol, propanol, hexane, heptane, toluene, benzene and cumene, and of these, heptane and cumene are preferable, because a fine film can be formed. The solvents can be used alone, or in combinations of two or more different solvents.

The solid content concentration of the liquid solution (total concentration of metal compounds (W) and organic compounds, which is used according to need) is within a range from 1 to 200 mM, preferably from 50 to 150 mM, and more preferably from 50 to 100 mM. When the solid content concentration is within these ranges, more uniform films can be formed, and thus it is preferable.

Pattern Forming Method

The purpose and usage of the pattern coating materials of the present invention will be described below, together with the procedure of the pattern forming method.

The pattern coating materials of the present invention are used for an etching process in which a pattern formed on a substrate is used as a mask. The term "a pattern formed on a substrate" here is a concept containing a pattern formed directly on a substrate, and a pattern formed on a laminate (that is, on an organic film) made by forming an organic film and the like on a substrate.

Examples of patterns include a pattern by nano imprinting and a resist pattern using a resist composition, and a resist pattern is preferable, from the viewpoint of fine processing.

Examples of the method to coat pattern coating materials of the present invention on a pattern formed on a substrate, and then to remove the coating pattern coating materials between patterns which are on the substrate or the organic film include the following: a method to coat the above coating materials on the entire surface of the substrate on which the patterns are formed, and washing the substrate on which the patterns are formed by using a solvent which dissolves the coating materials on the substrate or organic film, without dissolving the coating materials which surround the patterns. To enable the above method, it is required that the adhesion to the above coating materials should be different between the above materials used for the pattern and the above materials used for the substrate or the organic film. Also, it is needed to use a solvent which can remove, preferably by dissolution, the coating materials on the surface of the substrate or the organic film, without removing the coating materials on the surface of the pattern, by utilizing the differences in adhesion, when these materials are washed. Usually, the solvent is the same as the solvent in which the above coating materials are dissolved.

When the patterns formed on the laminate which is equipped with the substrate and the organic film are coated by the pattern coating materials of the present invention, patterns with high aspect ratio can be formed by etching the organic film under the patterns, using the coated patterns as a mask, and thus it is preferable.

Here, the aspect ratio is represented by the height of the pattern relative to the width of the bottom of the pattern (substrate's side).

Further, as an etching method of the organic film, it is preferable to use an oxygen plasma etching method or an etching method using $CF_4$ gas or $CHF_3$ gas, from the viewpoint of the efficiency. The pattern coating materials of the present invention show excellent etching resistance when these etching methods are used. Of these, the oxygen plasma etching method is preferable.

Preferable embodiments will be described below, in accordance with the procedure.

Figure 1B:
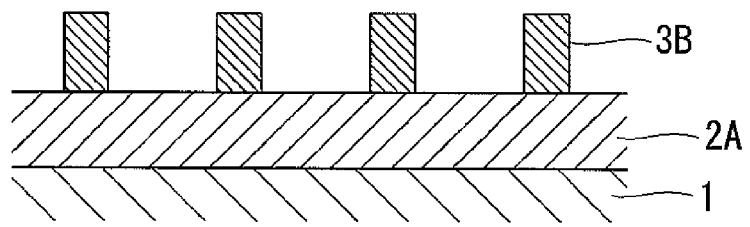
FIG. 1B is an explanatory drawing which shows an example of the procedure of a pattern forming method using a pattern coating material of the present invention.
Figure 1C:
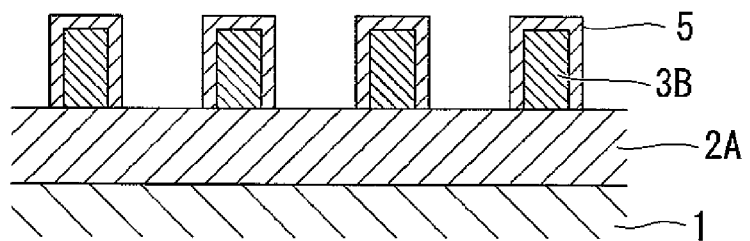
FIG. 1C is an explanatory drawing which shows an example of the procedure of a pattern forming method using a pattern coating material of the present invention.

FIGS. 1A to 1C show an example of the procedure of a pattern forming method using the pattern coating materials of the present invention.

As shown in FIG. 1A, the organic film 2A is formed on the substrate 1.

There are no restrictions on the substrate 1, and conventionally known substrates can be used. Examples thereof include substrates for electronic parts, and substrates for electronic parts on which a predetermined wiring pattern has already been formed. Specific examples thereof include substrates made of metals such as silicon wafer, copper, chromium, iron and aluminum; and substrates made of glass. As materials for the wiring pattern, for example, copper, aluminum, nickel and gold can be used.

The organic film 2A is formed in the following manner: a solution in which the resin components are dissolved in an organic solvent is first applied onto the surface of the substrate 1 using a spinner or the like, subsequently a baking treatment is conducted under temperature conditions of preferably 200 to 300° C. for 30 to 300 seconds, and preferably for 60 to 180 seconds.

The thickness of the organic film 2A is preferably within a range from 10 to 500 μm, and more preferably from 50 to 450 nm. When the thickness is within the above range, there can be exerted such effects that a resist pattern having a high aspect ratio can be formed, and sufficient etching resistance can be secured when the substrate is etched.

The materials for the organic film 2A will be described hereinafter.

Next, in a laminate formed according to the above manner, which is composed of the substrate 1 and the organic film 2A, a resist composition is applied onto the organic film 2A using a spinner or the like, a prebake is conducted under temperature conditions of 80 to 150° C. for 40 to 120 seconds, and preferably for 60 to 90 seconds. In this manner, the resist film 3A can be formed.

The thickness of the resist film 3A is preferably within a range from 50 to 500 nm, and more preferably from 50 to 450 nm. When the thickness is within the above ranges, there can be exerted such effects that a resist pattern with high resolution can be formed, and sufficient etching resistance can be obtained.

The materials for the resist composition will be described hereinafter. In the example of FIGS. 1A to 1C, the resist composition is a positive resist composition.

Subsequently, exposure is conducted from the side of the resist film 3A through a mask 4, and then post exposure baking (PEB) is conducted under temperature conditions of 80 to 150° C. for 40 to 120 seconds, and preferably for 60 to 90 seconds, and subjected to alkali development using a 2.38% by weight aqueous solution of tetramethylammonium hydroxide (TMAH), thereby removing the exposed portions. In this manner, a resist pattern 3B is formed on the organic film 2A, as shown in FIG. 1B.

Subsequently, as shown in FIG. 1C, a coating layer 5 is formed on this resist pattern 3B, using a pattern coating material of the present invention.

Specifically, the coating layer 5 is formed in the following manner. A coating film is formed by applying a pattern coating material onto the surface of the resist pattern 3B, thereby contacting the resist pattern 3B with the metal compound (W) included in the pattern coating material. According to need, it is left so as to promote chemical adsorption and/or physical adsorption of the resist pattern 3B with the metal compound (W) as described below. Then, the coating layer 5 is formed using a sol-gel method that the metal compound (W) in the coating film is hydrolyzed. This leads hydroxyl groups in the coating layer to be dehydration-condensed with one another, thereby forming the coating layer containing a metal oxide.

Here, it is preferable that the resist pattern 3B contains a reaction group (preferably a hydroxyl group or a carboxyl group), because the above reaction groups and the functional groups of the metal compound (W) contained in the pattern coating material are reacted or adsorbed, therefore the resist pattern 3B is bonded with the coating layer 5 rigidly.

Examples of application methods include methods (dip coating method) where the laminate on which the resist pattern 3B is formed is immersed in a solution containing the metal compound, and methods in which the pattern coating materials are layered onto the resist pattern 3B using spin coating. Also, methods such as an alternate adsorption method can be used.

The contact time and the contact temperature between the pattern 3B and the coating film containing the pattern coating material (including the step of forming the coating film and the optional step of subsequently leaving so as to promote the adsorption) cannot be completely restricted, because they differ according to the activity of the used metal compound (W). Generally, the contact time may be decided within a range from several seconds to several hours, and the contact temperature is within a range from 0 to 100° C. Also, by using an enzyme such as an acid or a base in the above reaction, it is possible to decrease the time needed to perform these steps to a large degree.

The term "chemical adsorption" in the present description means the condition where chemical bonds (covalent bond, hydrogen bond, coordinate bond and the like) or bonds by static electricity (ion bond and the like) are formed between the metal compound (W) and a reaction group (preferably hydroxyl group or carboxyl group) which lies on the surface of the resist pattern 3B and the organic film 2A, and the metal compound (W) or metallic ion thereof is bonded with the surface of the resist pattern 3B and the organic film 2A.

Subsequently, the metal compound (W) on the surface of the organic film between the resist pattern 3B is washed to be removed.

Also, extra metal compound (W) on the resist pattern 3B may be washed to be removed before hydrolysis according to need, from the viewpoint of the uniformity of film thickness. In these washings, an organic solvent which can be used as a solvent for pattern coating materials can be suitably used. If washing is performed, a thin film in the order of nanometers is formed with uniform thickness, with high accuracy, and with good reproducibility, because the chemically adsorbed metal compound (W) remains uniformly on the surface of the resist pattern 3B, while the metal compound (W) mainly adsorbed by weak physical adsorption is removed. Therefore, washing is particularly effective in the case that chemical adsorption is generated between the resist pattern 3B and the metal compound (W).

The washing can employ any of a variety of methods including methods in which extra organic solvent is suctioned up under reduced pressure after an organic solvent is provided on the surface of a coating film containing a pattern coating material; immersion washing methods in which the template is immersed in the organic solvent; spray washing methods; and steam cleaning methods.

The washing temperature is preferably the same temperature as that used in the step for applying the pattern coating material.

Subsequently, a hydrolysis treatment is performed.

The metal compound (W) generates a hydroxyl group by a hydrolysis treatment, and then the hydroxyl group is condensed, therefore a thin film containing a metal oxide is formed on the surface of the resist pattern 3B. In the case that the pattern coating material contains an organic matter, a complex thin film containing the organic matter and the metal oxide is formed.

As the method of hydrolysis, known methods can be used without restriction. For example, the operation of contacting the coating layer 5 with water is most commonly used. As water, deionized water is preferably used, so as to prevent contamination by impurities, and produce a metal oxide with high purity.

In the hydrolysis, the time needed to perform these steps can be decreased to a large degree by using an enzyme such as an acid or a base.

Further, hydrolysis can be performed by immersing a laminate containing the coating layer 5 into an organic solvent containing a small quantity of water.

In those cases where the metal compound displays a high level of reactivity with water, the metal compound can also be reacted with water vapor in the air to conduct the hydrolysis.

The operation of forming the hydrolyzed coating layer 5 is preferably conducted in an inert gas atmosphere, from the viewpoint of the ease of controlling reactivity. In this case, the operation is conducted without using the water vapor in the air.

After hydrolysis, the surface of the thin film is dried by using a drying gas such as nitrogen gas, if necessary. The operation enables a uniform thin film to be obtained.

The thickness of the coating layer 5 can be controlled by repeatedly conducting the contacting (coating) of the resist pattern 3B with the pattern coating material, and the operation of hydrolysis.

That is, a set of the operations of coating the pattern coating material, forming the coating film, washing if needed, and then conducting hydrolysis may be performed at least once, but by repeatedly performing the set of operations, a uniform thin film with desirable thickness can be formed.

Such operations enable the coating layer 5 with several nm to several tens of nm, or several hundreds of nm under certain conditions, to be formed with high accuracy.

As the metal compound (W), in the case of using the pattern coating material containing a metal alkoxide which has one kind of metal atom such as silicon tetraisocyanate and titanium butoxide, a thin film with several angstroms of thickness can be laminated sequentially depending on the contact conditions.

In this case, the increasing amount of the thickness per cycle corresponds to a single lamination of the pattern coating material. On the other hand, when fine particles of an alkoxide gel are used as the metal compound (W), a thin film with a thickness of about 60 nm per cycle can be laminated. Further, in the case of forming the coating film including the pattern coating material by the use of a spin coating method, the film thickness can be arbitrarily controlled from several nm to about 200 nm by changing the solvent, the concentration of the metal compound (W) and the spin speed.

On this occasion, by changing the kind of metal compound (W) every cycle, a laminate where thin films including different kinds of metal compounds (W) are laminated can be obtained.

The thickness of the coating layer is preferably within a range from 1 to 100 nm, and more preferably from 1 to 80 nm. When the thickness is within the above range, enough resistance against etching, preferably against dry etching, can be obtained as the effect.

The total thickness (height) of the organic film pattern 2B, the resist pattern 3B and the coating layer 5 is preferably no more than 1 μm, more preferably no more than 0.7 μm, and most preferably no more than 0.5 μm, from the viewpoint of the balance of throughput taking account of the aspect ratio of the objective pattern and the time required to etch the organic film 2A. The lower limit of the total thickness is not particularly restricted, and it is preferably 0.1 μm, and more preferably 0.15 μm.

Figure 1D:
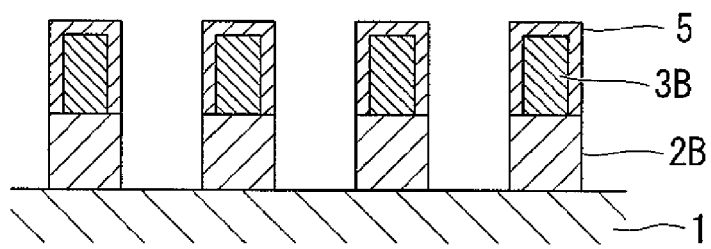
FIG. 1D is an explanatory drawing which shows an example of the procedure of a pattern forming method using a pattern coating material of the present invention.

Next, as shown in FIG. 1D, using the resist pattern 3B coated by the coating layer 5 as a mask, the organic film 2A underlying it is etched preferably by dry etching. As the etching method, an etching using $CF_4$ gas or $CHF_3$ gas is preferable, and oxygen plasma etching is also preferable, from the viewpoint of obtaining enough effect of protecting the resist pattern 3B by the coating layer 5 against etching, and having an excellent production efficiency.

Of these, as described below, it is preferable that the organic film 2A is constituted by a material which can be etched easily by oxygen plasma etching, and has a relatively high resistance against a halogen gas, specifically against $CF_4$ gas or $CHF_3$ gas, and examples of the material include a novolak resin. Generally, etching of the substrate 1 and the like is conducted by using a halogen gas such as a fluorocarbon gas. Therefore, containing this kind of material in the organic film 2A enables the processability to be improved by using oxygen plasma etching, when the organic film pattern 2B is formed. Also, it enables the etching resistance to be improved in the following process wherein the substrate 1 and the like are etched using a halogen gas such as a fluorocarbon gas.

As a result, the organic film pattern 2B is formed from the organic film 2A by conducting this etching, and a pattern where the resist pattern 3B is laminated on the organic film pattern 2B can be formed with a high aspect ratio.

Then, the substrate 1 is fabricated by etching using the pattern obtained by the above processes as a mask, and the semiconductor device and the like can be manufactured. The etching in this case is preferably an etching using a halogen gas, and more preferably an etching using a fluorocarbon gas, particularly $CF_4$ gas or $CHF_3$ gas.

The coating layer 5 exerts the function of protecting the resist pattern 3B when etching of the organic film 2A is conducted. Also, it exerts the function of protecting a pattern composed of the organic pattern 2B and the resist pattern 3B when etching of the substrate 1 is conducted. That is, it enables the etching resistance of the laminated pattern to be improved.

In this description, as an example, it is explained that the coating layer 5 is provided on the upper surface and the side wall of the resist pattern 3B, as shown in FIG. 1C. As another example, it is also possible to provide the coating layer 5 only on the upper surface of the resist pattern 3B, not on the side wall thereof. To improve the function of the organic film 2A as an etching mask, it is preferable to provide the coating layer 5 on the upper surface and the side wall.

Further, a method of forming a pattern which laminates the organic film 2A and the resist film 3A is explained as an example in this description. As another example, a coating layer containing a pattern coating material is formed on the pattern formed directly on the substrate 1 and, by using the pattern containing the coating layer as a mask, etching of the substrate under the pattern can also be conducted. In this case, since the pattern is protected by the coating layer, the pattern has high etching resistance, and can endure severe etching conditions.

Resist Composition (Pattern Forming Material)

As shown in FIG. 1B, examples of materials to form a pattern such as the resist pattern 3B include a nano-imprinting material and a resist composition, as described above. Of these, a resist composition is preferable.

Examples of pattern forming methods include imprinting methods and lithography methods. Of these, lithography methods are preferable. Lithography methods are preferable from the viewpoint of forming a fine pattern with high accuracy.

A suitable resist composition contains an organic compound which has a molecular weight of 500 or more and which has a hydrophilic group. By having such a constitution, it is possible to excellently form a coating layer including a pattern coating material on the pattern formed by the resist composition, thereby enabling a pattern with an excellent shape to be obtained.

An organic compound contained within the resist composition can be broadly classified either as a low molecular weight compound with a molecular weight of 500 to 2,000, or as a high molecular weight compound with a molecular weight exceeding 2,000. In the case of a high molecular weight compound, the molecular weight value refers to the polystyrene equivalent weight average molecular weight determined using gel permeation chromatography (GPC).

If the molecular weight of the organic compound is less than 500, then pattern formation at nano-level is difficult, therefore such compounds are undesirable.

The hydrophilic group of the organic compound included in the resist composition is preferably at least one group selected from the group consisting of hydroxyl groups, carboxyl groups, carbonyl groups (—C(O)—), ester groups (ester bond; —C(O)—O—), amino groups and amide groups. Of these, a hydroxyl group, particularly an alcoholic hydroxyl group or a phenolic hydroxyl group; a carboxyl group; and an ester group are more preferable.

Of these, a carboxyl group, an alcoholic hydroxyl group and a phenolic hydroxyl group are particularly preferable, because of easily forming a coating layer on the surface of a pattern. Also, they are preferable, because a pattern with minimal line edge roughness (side wall irregularities of a pattern) can be formed.

When a hydrophilic group is on the surface of a pattern, the hydrophilic group can be used as a functional group (reaction group) which interacts with a material of a coating layer formed on the pattern. Thereby, a coating layer with high adhesion to the pattern can be formed. Also, a coating layer with high density can be formed on the pattern, thus enabling a pattern with the shape that displays good mechanical strength.

The content of hydrophilic groups within the organic compound contained in the resist composition affects the quantity of the hydrophilic groups per unit area on the surface of a pattern. Therefore, it can affect the adhesion and density of the coating layer formed on a pattern.

In those cases where the organic compound is an aforementioned high molecular weight compound, the quantity of hydrophilic groups is preferably at least 0.2 equivalents, more preferably within a range from 0.5 to 0.8 equivalents, and still more preferably from 0.6 to 0.75 equivalents.

This means that if the high molecular weight compound includes a structural unit containing a hydrophilic group and other structural units, then the quantity of the former structural unit is at least 20 mol %, more preferably from 50 to 80 mol %, and still more preferably from 60 to 75 mol %.

In the present description, the term "structural unit" or "unit" means a monomer unit that contributes to the formation of a polymer.

There are two types of resist compositions, that is, a positive type resist composition and a negative type resist composition. Of these, a positive type resist composition is preferred in the present invention.

Further, the resist composition is preferably a chemically amplified resist composition including an acid generator (B) which generates an acid upon exposure. Here, exposure constitutes a concept including entire irradiation with radiation such as electron beam.

That is, in the resist composition, an alkali soluble resin or a resin which can be alkali soluble (hereinafter referred to as a component (A)) can be used as the aforementioned organic compound. The former has a so-called negative type radiation-sensitive property, and the latter has a so-called positive type radiation-sensitive property.

In the case of a negative resin composition, the resist composition is mixed with the component (B) and a crosslinking agent. When an acid is generated from the component (B) upon exposure in the case of forming a resist pattern by a lithography method, the acid reacts to cause crosslinking between the component (A) and the crosslinking agent, and thus the resist composition becomes alkali-insoluble. As the crosslinking agent, typically an amino-based crosslinking agent such as a melamine containing methylol groups or alkoxymethyl groups, urea and glycoluril is used.

In the case of a positive composition, the component (A) is an alkali-insoluble resin that contains so-called acid dissociable, dissolution inhibiting groups, and when an acid is generated from the component (B) upon exposure, this acid causes the acid dissociable, dissolution inhibiting groups to dissociate, making the component (A) alkali-soluble.

It is preferable that the organic compound has an acid dissociable, dissolution inhibiting group in addition to a hydrophilic group. Here, the hydrophilic group may have the function as the acid dissociable, dissolution inhibiting group.

In those cases where the organic compound is an aforementioned high molecular weight compound, resins with a weight average molecular weight within a range from more than 2,000 to 3,000 are used, which include a unit containing the hydrophilic group and a unit containing the acid dissociable, dissolution inhibiting group, wherein the former unit accounts for at least 20 mol %, preferably at least 50 mol %.

The weight average molecular weight is more preferably within a range from 3,000 to 30,000, still more preferably from 5,000 to 20,000.

The proportion of the unit containing the aforementioned hydrophilic group is more preferably at least 60 mol %, and still more preferably at least 75 mol %. There are no particular restrictions on the upper limit for the above proportion, and the upper limit is preferably 80 mol % or less.

The unit containing the hydrophilic group is preferably a unit having a carboxy group, an alcoholic hydroxyl group or a phenolic hydroxyl group, and more preferably a unit derived from acrylic acid, methacrylic acid, an (α-lower alkyl) acrylate ester having an alcoholic hydroxyl group, or hydroxystyrene.

On the other hand, in those cases where the organic compound is the aforementioned low molecular weight compound, the quantity of hydrophilic groups is preferably within a range from 1 to 20 equivalents, and more preferably from 2 to 10 equivalents per molecule of the low molecular weight compound.

The expression "from 1 to 20 equivalents of hydrophilic groups per molecule" means that 1 to 20 hydrophilic groups exist within each molecule of the compound.

Now, preferred embodiments of the resist composition in the present invention will be described below. (1) An example of a radiation-sensitive resist composition containing a high molecular weight compound as an organic compound include a resist composition which includes (A-1) a high molecular weight compound having a hydrophilic group and an acid dissociable, dissolution inhibiting group, and (B) an acid generator. (2) An example of a radiation-sensitive resist composition containing a low molecular weight compound as an organic compound include a resist composition which includes (A-2) a low molecular weight compound having a hydrophilic group and an acid dissociable, dissolution inhibiting group, and (B) an acid generator.

In the resist composition (1) or (2), the component (A-1) and the component (A-2) can be used together.

As the component (A-1) and (A-2), one organic compound or the mixture of two or more organic compounds can be used, appropriately selected from organic compounds conventionally used as a chemically amplified resist, as long as it has a hydrophilic group and the molecular weight is at least 500.

A specific explanation will be given below.

Component (A-1)

As the component (A-1), a novolak resin having a hydrophilic group and an acid dissociable, dissolution inhibiting group; a hydroxystyrene-based resin; an (α-lower alkyl) acrylate ester resin; and a copolymer resin containing a structural unit derived from hydroxystyrene and a structural unit derived from an (α-lower alkyl) acrylate ester are preferable used.

In this description, the term "(α-lower alkyl) acrylic acid" is a generic term that includes both α-lower alkyl acrylic acid and acrylic acid. Furthermore, the term "(α-lower alkyl) acrylate" is a generic term that includes both α-lower acrylate and acrylate. The term "α-lower alkyl acrylic acid" or "(α-lower alkyl) acrylate" means those wherein a lower alkyl group is bonded to the carbon atom which the carbonyl group of acrylic acid or acrylate is bonded to, respectively. The term "(α-lower alkyl) acrylate ester" means an ester derivative of "(α-lower alkyl) acrylic acid." The term "structural unit derived from (α-lower alkyl) acrylate ester" means a structural unit that is formed by the cleavage of the ethylenic double bond of the (α-lower alkyl) acrylate ester, and is hereinafter also referred to as a (α-lower alkyl) acrylate structural unit. The term "structural unit derived from hydroxystyrene" means a structural unit that is formed by the cleavage of the ethylenic double bond of the hydroxystyrene or α-lower alkyl hydroxystyrene, and is hereinafter also referred to as a hydroxystyrene structural unit.

The term "α-lower alkyl hydroxystyrene" means that wherein a lower alkyl group is bonded to the carbon atom which the phenyl group of hydroxystyrene is bonded to.

In "structural unit derived from an α-lower alkyl acrylate ester" and "structural unit derived from α-lower alkyl hydroxystyrene", lower alkyl groups bonded to the α-position are alkyl groups having 1 to 5 carbon atoms, preferably linear or branched alkyl groups, and suitable examples thereof include a methyl group, an ethyl group, a propyl group, an isopropyl group, a n-butyl group, an isobutyl group, a tert-butyl group, a pentyl group, an isopentyl group and a neopentyl group. Of these, a methyl group is industrially preferable.

There are no particular restrictions on the resin component used as the component (A-1), and suitable examples thereof include structural units (a1) containing a phenolic hydroxyl group described below, at least one structural unit selected from the group consisting of structural units (a2) and structural units (a3), which are each described below, and resin components for a positive resist (a4) containing alkali-insoluble structural units, which is used according to need.

The resin component increases alkali-solubility by an action of an acid. That is, cleavage is caused in the structural unit (a2) and (a3) by an action of an acid generated from an acid generator upon exposure, and thus alkali solubility enhances in the resin which was originally insoluble in an alkali developing solution.

As a result, a chemically amplified positive resist pattern can be obtained by exposure and development.

Structural Unit (a1)

Structural unit (a1) is a unit having a phenolic hydroxyl group, preferably a unit derived from hydroxystyrene represented by general formula (I) shown below.

(In the formula, R represents a hydrogen atom or a lower alkyl group.)

In the formula, R is a hydrogen atom or a lower alkyl group. Herein, the lower alkyl group is the same as those described above. As R, a hydrogen atom or a methyl group is particularly preferable. The expression of R is the same hereinafter.

There are no restrictions on the bonding position of —OH to the benzene ring, and the 4-position (para-position), which is described in the formula, is preferable.

The quantity of the structural unit (a1) within the resin is preferably within a range from 40 to 80 mol %, and more preferably from 50 to 75 mol %, from the point of view of forming a pattern. By ensuring that this quantity is at least 40 mol %, the solubility of the resin in the alkali developing solution can be improved, and a favorable improvement in the resist pattern shape can also be obtained. By ensuring the quantity is no more than 80 mol % enables a favorable balance to be achieved with the other structural units.

Further, the quantity of the structural unit (a1) within the resin is preferably at least 50 mol %, more preferably at least 60 mol %, and still more preferably at least 75 mol %, from the point of view of forming a coating layer on the pattern. There are no particular restrictions on the upper limit for the above proportion, and the upper limit is preferably 80 mol % or less. By ensuring the quantity is within the above range, an excellent coating layer can be formed on the pattern, and thus a pattern with excellent shape can be obtained. Also, the adhesion of the pattern to the coating layer is excellent.

Structural Unit (a2)

The structural unit (a2) is represented by a general formula (II) shown below.

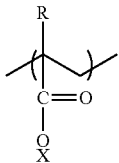

(II)

(Wherein, R is same as defined above, and X represents an acid dissociable, dissolution inhibiting group.)

Examples of the acid dissociable, dissolution inhibiting group X include alkyl groups with a tertiary carbon atom in which the tertiary carbon atom is bonded to the ester group (—C(O)O—), as well as cyclic acetal groups such as a tetrahydropyranyl group and tetrahydrofuranyl group.

As this type of acid dissociable, dissolution inhibiting group, namely the group X, any group typically used within chemically amplified positive resist compositions can be used, in addition to the groups described above.

Preferred examples of the structural unit (a2) include the units represented by the general formula (XIII) shown below.

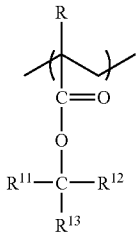

(XIII)

In this formula, R is as defined above, $R^{11}$, $R^{12}$ and $R^{13}$ each represent, independently, a lower alkyl group (which may be a linear or branched group, and preferably contains from 1 to 5 carbon atoms). Furthermore, of $R^{11}$, $R^{12}$ and $R^{13}$, $R^{11}$ is a lower alkyl group, and $R^{12}$ and $R^{13}$ may also be bonded together to form a monocyclic or polycyclic alicyclic group (in which the number of carbon atoms within the alicyclic group is preferably from 5 to 12).

In those cases where the structural unit does not include an alicyclic group, units in which $R^{11}$, $R^{12}$ and $R^{13}$ all represent methyl groups are preferred.

In those cases where the structural unit includes an alicyclic group, then in the case of a monocyclic alicyclic group, units containing a cyclopentyl group, cyclohexyl group or the like are preferred.

Furthermore, in the case of a polycyclic alicyclic group, examples of preferred units include those represented by general formula (XIV) shown below.

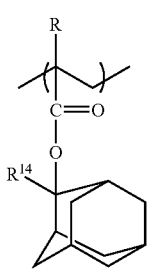

(XIV)

(Wherein, R is same as defined above, and $R^{14}$ represents a lower alkyl group (which may be a linear or branched group, and preferably contains from 1 to 5 carbon atoms).)

Also, as a structural unit which has an acid dissociable, dissolution inhibiting group containing polycyclic alicyclic group, examples of preferred units includes those represented by general formula (XV) shown below.

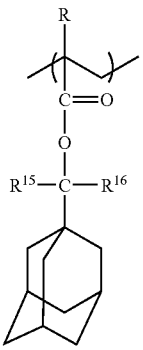

(XV)

(Wherein, R is same as defined above, and $R^{15}$ and $R^{16}$ each represent, independently, a lower alkyl group (which may be a linear or branched group, and preferably contains from 1 to 5 carbon atoms).)

The quantity of the structural unit (a2) within the resin is typically within a range from 5 to 50 mol %, preferably from 10 to 40 mol %, and more preferably from 10 to 35 mol %.

Structural Unit (a3)

The structural unit (a3) is a unit having an acid dissociable, dissolution inhibiting group, represented by general formula (III) shown below.

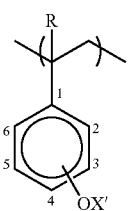

(III)

(Wherein, R is same as defined above, and X' represents an acid dissociable, dissolution inhibiting group.)

Specific examples of the acid dissociable, dissolution inhibiting group X' include tertiary alkyloxycarbonyl groups such as a tert-butyloxycarbonyl group and tert-amyloxycarbonyl group; tertiary alkyloxycarbonylalkyl groups such as a tert-butyloxycarbonylmethyl group and tert-butyloxycarbonylethyl group; tertiary alkyl groups such as a tert-butyl group and tert-amyl group; cyclic acetal groups such as a tetrahydropyranyl group and tetrahydrofulranyl group; alkoxyalkyl groups such as an ethoxyethyl group and a methoxypropyl group.

Of these groups, a tert-butyloxycarbonyl group, a tert-butyloxycarbonylmethyl group, a tert-butyl group, a tetrahydropyranyl group, and an ethoxyethyl group are preferred.

An acid dissociable, dissolution inhibiting group other than those described above can also be used as an acid dissociable, dissolution inhibiting group X', appropriately selected from those used in the chemically amplified positive resist composition.

In the general formula (III), there are no restrictions on the bonding position of the group (—OX'), which is bonded to the benzene ring, and the 4-position para-position) shown in the formula is preferable.

The quantity of the structural unit (a3) within the resin is within a range from 5 to 50 mol %, preferably from 10 to 40 mol %, and more preferably from 10 to 35 mol %.

Structural Unit (a4)

The structural unit (a4) is a unit which is alkali insoluble, represented by general formula (IV) shown below.

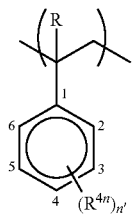

(IV)

(Wherein, R is same as defined above $R^{41}$ represents a lower alkyl group, and n' represents either 0 or an integer from 1 to 3.)

The lower alkyl group $R^{41}$ may be either a linear or a branched chain, and preferably contains from 1 to 5 carbon atoms.

n' is either 0 or an integer from 1 to 3, and is preferably 0.

The quantity of the structural unit (a4) within the resin component is within a range from 1 to 40 mol %, and preferably from 5 to 25 mol %. By ensuring this quantity is at least 1 mol %, the level of improvement in shape (and particularly the improvement in thickness loss) is enhanced, whereas ensuring the quantity is no more than 40 mol % enables a favorable balance to be achieved with the other structural units.

The component (A-1) contains the aforementioned structural unit (a1) and at least one selected from the group consisting of the structural unit (a2) and (a3), and also may optionally contain the structural unit (a4). Also, as the component (A-1), a copolymer having all of the structural units (a1), (a2), (a3) and (a4), or a mixture of the copolymers which have one or more of these structural units may be used. Also, these may be used in combination.

Furthermore, the component (A-1) may also include other units other than the structural units (a1), (a2), (a3) and (a4) described above, although the structural units (a1), (a2), (a3) and (a4) preferably account for at least 80 mol %, more preferably at least 90 mol %, and most preferably 100 mol % of the component.

Particularly preferred configurations of the component (A-1) include: a copolymer (1) containing a structural unit (a1) and a structural unit (a3), or a mixture of two or more different copolymers of this type; or a copolymer (2) containing a structural unit (a1), a structural unit (a2) and a structural unit (a4); or a mixture of two or more different copolymers of this type, because either of these two configurations or a mixture of the two offer a simple way of achieving the desired effects. Also, they provide a favorable improvement in the heat resistance.

Particularly, a mixture of polyhydroxystyrene in which the hydroxyl group has been protected with tertiary-alkyloxycarbonyl groups and polyhydroxystyrene in which the hydroxyl group has been protected with 1-alkoxyalkyl groups is preferable.

The mass ratio of the mixture ((polyhydrostyrene in which the hydroxyl group has been protected with tertiary-alkyloxy-carbonyl groups)/(polyhydroxystyrene in which the hydroxyl group has been protected with 1-alkoxyalkyl groups)) is, for example, from 1/9 to 9/1, preferably 2/8 to 8/2, and more preferably 2/8 to 5/5.

The polystyrene equivalent weight average molecular weight of the component (A-1), as determined by GPC, is preferably within a range from more than 2,000 to 30,000, more preferably from 3,000 to 30,000, and still more preferably from 5,000 to 20,000.

The component (A-1) can be produced by polymerization of the monomers that provide the various structural units, using known methods.

As a resin component (A-1') other than those described above, which is suited for the component (A-1), a resin component containing an (α-lower alkyl) acrylate ester resin is preferred, and a resin component composed of an (α-lower alkyl) acrylate ester is more preferred, from the viewpoint of enabling a pattern with lower etching resistance to be formed.

In (α-lower alkyl) acrylate ester resins, a resin containing the structural unit (a5) derived from an (α-lower alkyl) acrylate ester having an acid dissociable, dissolution inhibiting group is preferable. Here, the α-lower alkyl groups are the same as those described above.

An acid dissociable, dissolution inhibiting group in the structural unit (a5) is the group which has an alkali dissolution inhibiting property where the entire component (A-1') is kept alkali-insoluble before exposure, and also has the property where the component (A-1') is changed to be alkali-soluble after exposure, since the acid dissociable, dissolution inhibiting group is dissociated from the component (A-1') by the action of the acid generated from the component (B).

An acid dissociable, dissolution inhibiting group, appropriately selected from those suggested in resins used for a resist composition for an ArF excimer laser can be used. Generally, cyclic or chain-like alkoxyalkyl groups, and groups which form cyclic or chain-like tertiary alkyl esters with carboxyl groups of (α-lower alkyl) acrylic acids are broadly known.

Here, the term "a group which forms a tertiary alkyl ester" means a group which forms an ester by replacing a hydrogen atom of a carboxyl group of an acrylic acid. That is, it represents the structure where a tertiary carbon atom of a chain-like or cyclic tertiary alkyl group is bonded with an oxygen atom at the terminal of a carbonyloxy group [—C(O)—O—] of an acrylate ester. In the tertiary alkyl ester, the bond of the oxygen atom with the tertiary carbon atom is cleaved by the action of an acid.

Here, the term "a tertiary alkyl group" means an alkyl group having a tertiary carbon atom.

Examples of a group which forms a chain-like tertiary alkyl ester include a tert-butyl group, a tert-amyl group.

Examples of a group which forms a cyclic tertiary alkyl ester include the same as those described below in "an acid dissociable, dissolution inhibiting group which has an aliphatic cyclic group."

"A cyclic or chain-like alkoxyalkyl group" forms an ester by replacing a hydrogen atom of a carboxyl group. That is, it forms the structure where the alkoxyalkyl group is bonded with an oxygen atom at the terminal of a carbonyloxy group [—C(O)—O—] of an acrylate ester. In the structure, the bond of the oxygen atom with the alkoxyalkyl group is cleaved by the action of an acid.

Examples of the cyclic or chain-like alkoxyalkyl group include a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a5), a structural unit having an acid dissociable, dissolution inhibiting group which has a cyclic group, particularly an aliphatic cyclic (alicyclic) group, is preferred.

In the present description, the term "aliphatic" is a relative concept used in relation to the term "aromatic", and defines a group, compound or the like that has no aromaticity. The term "aliphatic cyclic group (alicyclic group)" means a monocyclic or polycyclic group which has no aromaticity.

The alicyclic group may be either monocyclic or polycylic, and can be selected appropriately from the multitude of these types of groups that have been proposed for use with ArF resists. From the viewpoint of the etching resistance, a polycyclic alicyclic group is preferred. Also, as the alicyclic group, a hydrocarbon group is preferable, particularly a saturated hydrocarbon group (alicyclic group) is preferable.

Examples of suitable monocyclic alicyclic groups include groups in which one hydrogen atom has been removed from a cycloalkane. Examples of suitable polycyclic alicyclic groups include groups in which one hydrogen atom has been removed from a polycycloalkane such as a bicycloalkane, tricycloalkane and tetracycloalkane.

Specific examples of monocyclic alicyclic groups include a cyclopentyl group and cyclohexyl group. Specific examples of polycyclic alicyclic groups include groups in which one hydrogen atom has been removed from a polycycloalkane such as adamantane, norbornane, isobornane, tricyclodecane and tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, or a tetracyclododecanyl group in which one hydrogen atom has been removed from tetracyclododecane is industrially preferable.

More specifically, the structural unit (a5) is preferably at least one unit selected from the group consisting of general formulae (I') to (III') shown below.

Also, it is preferably a structural unit derived from an (α-lower alkyl) acrylate ester which has a cyclic alkoxyalkyl group described above in the ester moiety, and specifically, it is preferably at least one unit selected from the group consisting of structural units derived from aliphatic polycyclic alkyloxy lower alkyl (α-lower alkyl) acrylate esters which may have substituent groups, such as a 2-adamantoxymethyl group, 1-methyl adamantoxymethyl group, 4-oxo-2-adamantoxymethyl group, 1-adamantoxyethyl group, and 2-adamantoxyethyl group.

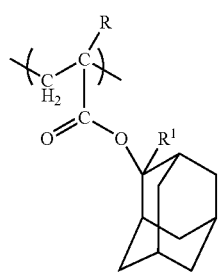

(I')

(In the formula (I'), R represents the same as those described above; and $R^1$ represents a lower alkyl group.)

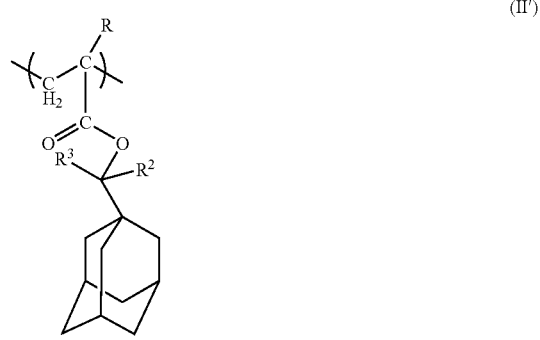

(II')

(In the formula (II'), R represents the same as those described above; and $R^2$ and $R^3$ each represent, independently, a lower alkyl group.)

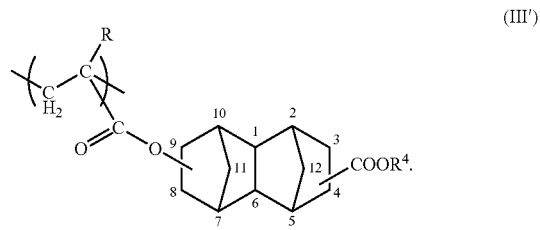

(III')

(In the formula (III'), R represents the same as those described above; and $R^4$ represents a tertiary alkyl group.)

In the formulae (I') to (III'), a hydrogen atom or a lower alkyl group of R is the same as the hydrogen atom or the lower alkyl groups bonded to the α-position of acrylate esters described above.

As the lower alkyl group of $R^1$, a linear or branched alkyl group having 1 to 5 carbon atoms is preferable, and specific examples thereof include a methyl group, an ethyl group, a propyl group, an isopropyl group, a n-butyl group, an isobutyl group, a pentyl group, an isopentyl group and a neopentyl group. Of these groups, a methyl group or an ethyl group is preferable because of the ease of the industrial availability.

It is preferable that the lower alkyl groups of $R^2$ and $R^3$ are, each independently, a linear or branched alkyl group having 1 to 5 carbon atoms. Of these groups, both $R^2$ and $R^3$ are industrially preferably methyl groups. Specific examples of general formula (II') include a structural unit derived from 2-(1-adamantyl)-2-propyl acrylate.

$R^4$ is a chain-like or cyclic tertiary alkyl group. Examples of the chain-like tertiary alkyl groups include a tert-butyl group and tert-amyl group, and of these, a tert-butyl group is industrially preferable.

The cyclic tertiary alkyl group is same as described above in "an acid dissociable, dissolution inhibiting group having an alicyclic group", and examples thereof include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group and 1-methylcyclopentyl group.

Here, the group $COOR^4$ may be bonded to the 3- or 4-position of the tetracyclododecanyl group shown in the formula, but the bonded position cannot be identified. Similarly, the carboxyl group of the acrylate structural unit may be bonded to the 8- or 9-position shown in the formula.

The structural unit (a5) can be used alone, or in combinations of two or more different units.

The proportion of the structural unit (a5) within the (α-lower alkyl) acrylate ester resin component is preferably within a range from 20 to 60 mol %, more preferably from 30 to 50 mol %, and most preferably from 35 to 45 mol %, relative to the total of all structural units which constitute the component (A-1'). When this proportion is not less than the lower limit in the above range, a pattern can be obtained, whereas when the proportion is not more than the upper limit in the above range, good quantitative balance with the other components can be attained.

In addition to the aforementioned structural unit (a5), the (α-lower alkyl) acrylate ester resin preferably includes a structural unit (a6) derived from a (α-lower alkyl) acrylate ester that contains a lactone-containing group. The structural unit (a6) is effective so as to improve the adhesion between the resist film and the substrate, and to improve hydrophilicity with the developing solution. Also, it contributes to the formation of a coating layer with high adhesion to a pattern can be formed.

A lower alkyl group or a hydrogen atom is bonded to the carbon atom at the α-position of the structural unit (a6). Lower alkyl groups bonded to the carbon atom at the α-position are same as those in the structural unit (a5), and of these, a methyl group is preferable.

Examples of the structural unit (a6) include structural units wherein a monocyclic alicyclic group composed of a lactone ring, or a polycyclic alicyclic group containing a lactone ring, is bonded to the ester side-chain moiety of an acrylate ester. Here, the term "lactone ring" represents a single ring containing a —O—C(O)— structure, and this ring is counted as the first ring. Accordingly, the case in which the only ring structure is the lactone is referred to as a monocyclic group, and groups containing other ring structures are described as a polycyclic group regardless of the structure of the other rings.

Examples of the structural unit (a6) include monocyclic groups in which one hydrogen atom has been removed from γ-butyrolactone, and polycyclic groups in which one hydrogen atom has been removed from a lactone ring-containing bicycloalkane.

More specifically, the structural unit (a6) is preferably at least one selected from the group consisting of general formulae (IV') to (VII') shown below.

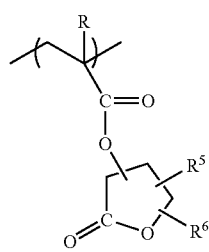
(IV')

(In the formula (IV'), R represents the same as those described above; and $R^5$ and $R^6$ each represents, independently, a hydrogen atom or a lower alkyl group.)

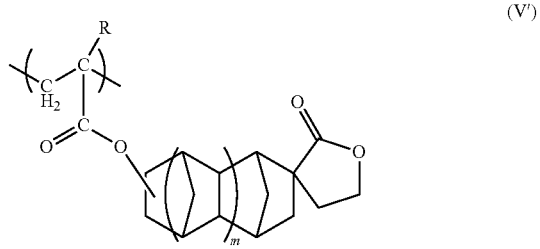
(V')

(In the formula (V'), R represents the same as those described above; and m represents 0 or 1.)

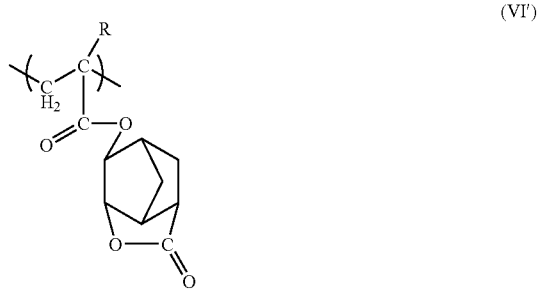
(VI')

(In the formula (VI'), R represents the same as those described above.)

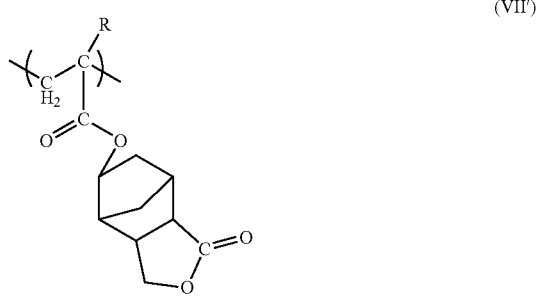
(VII')

(In the formula (VII'), R represents the same as those described above.)

In the formula (IV'), $R^5$ and $R^6$ each represent, independently, a hydrogen atom or a lower alkyl group, and preferably a hydrogen atom. In $R^5$ and $R^6$, the lower alkyl group is preferably a linear or branched alkyl group of 1 to 5 carbon atoms, and specific examples thereof include a methyl group, an ethyl group, a propyl group, an isopropyl group, a n-butyl group, an isobutyl group, a tert-butyl group, a pentyl group, an isopentyl group and a neopentyl group. From an industrial viewpoint, a methyl group is preferable.

Of the structural units represented by the general formulae (IV') to (VII'), the structural unit represented by the general formula (IV') is preferable industrially and because of the inexpensive price. Of the structural units represented by the general formula (IV'), it is most preferable that R is a methyl group, $R^5$ and $R^6$ are both hydrogen atoms, and the position of the ester bond between methacrylate ester and γ-butyrolactone is the α-position of the lactone ring, that is, α-methacryloyloxy-γ-butyrolactone.

The structural unit (a6) can be used alone, or in combinations of two or more different units.

The proportion of the structural unit (a6) in the (α-lower alkyl) acrylate ester resin components is preferably within a range from 20 to 60 mol %, more preferably from 20 to 50 mol %, and most preferably from 30 to 45 mol %, relative to total of all the structural units which constitute the component (A-1'). When this proportion is not less than the lower limit of the above range, the lithography characteristics can be improved. On the other hand, when this proportion is not more than the upper limit, good quantitative balance with the other components can be attained.

In the component (A-1'), (α-lower alkyl) acrylate ester resin components preferably include, either in addition to the structural unit (a5) or in addition to the structural unit (a5) and (a6), a structural unit (a7) derived from an acrylate ester that contains a polar group-containing polycyclic group.

By including the structural unit (a7), hydrophilicity of the entire (α-lower alkyl) acrylate ester resin components is enhanced, thereby improving the affinity with the developing solution, and improving the alkali solubility within the exposed portions of the resist. Therefore, the structural unit (a7) contributes to an improvement in resolution. Also, a coating layer with high adhesion to a pattern can be formed.

A lower alkyl group or a hydrogen atom is bonded to the carbon atom of the α-position of the structural unit (a7). The lower alkyl group bonded to the carbon atom of the α-position are same as those described for the structural unit (a5), and is preferably a methyl group.

Examples of the polar group include a hydroxyl group, a cyano group, a carboxyl group and an amino group, and of these, a hydroxyl group is preferable.

A polycyclic group selected appropriately from the polycyclic groups in the aliphatic cyclic groups described above in "an acid dissociable, dissolution inhibiting group which has an aliphatic cyclic group" of the structural unit (as) can be used as the polycyclic group of the structural unit (a7).

As the structural unit (a7), at least one selected from general formulae (VIII') to (IX') shown below is preferable.

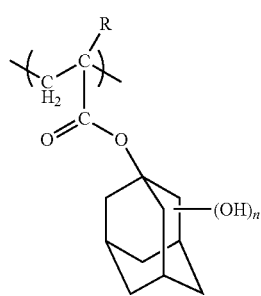

(VIII')

(In the formula (VIII'), R represents the same as those described above; and n represents an integer from 1 to 3.)

In the formula (VIII'), R is the same as those described in the above formulae (I) to (III').

Of these, it is preferable that n is 1, and the hydroxyl group is bonded to the 3-position of the adamantyl group.

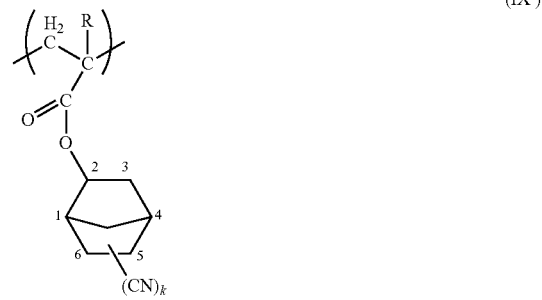

(IX')

(In the formula (IX'), R represents the same as those described above; and k represents an integer from 1 to 3.)

Of these, k is preferably 1. Also, it is preferable that the cyano group is bonded to the 5-position or 6-position of the norbornyl group.

The structural unit (a7) can be used alone, or in combinations of two or more different units.

The proportion of the structural unit (a7) within the (α-lower alkyl) acrylate ester resin component is preferably within a range from 10 to 50 mol %, more preferably 15 to 40 mol %, and still more preferably 20 to 35 mol %, relative to the total of all the structural units which constitute the component (A-1'). When this proportion is not less than the lower limit of the above range, the lithography characteristics can be improved. On the other hand, when this proportion is not more than the upper limit, good quantitative balance with the other components can be attained.

The (α-lower alkyl) acrylate ester resin component (A-1') may include structural units other than the structural units (a5) to (a7) described above, but the total quantity of the structural units (a5) to (a7) is preferably within a range from 70 to 100 mol %, and more preferably 80 to 100 mol %, relative to the total of all the structural units.

The (α-lower alkyl) acrylate ester resin component may induce a structural unit (a8) other than the structural units (a5) to (a7) described above.

There are no restrictions on the structural unit (a8), as long as it is a structural unit which is not classified in the structural units (a5) to (a7).

Preferable examples of the structural unit (a8) include structural units which contain a polycyclic aliphatic hydrocarbon group and which is derived from an (α-lower alkyl) acrylate ester. As the polycyclic aliphatic hydrocarbon groups, for example, those which are appropriately selected from polycyclic groups in the aliphatic cyclic groups described above in "an acid dissociable, dissolution inhibiting group which has an aliphatic cyclic group" can be used. Particularly, at least one selected from a tricyclodecanyl group, an adamantyl group, a tetracyclododecanyl group, a norbornyl group and an isobornyl group is preferable, from the viewpoint of industrial availability. The structural unit (a8) is preferably an acid non-dissociable group.

Specific examples of the structural unit (a8) include structural units of the general formulae (X) to (XII) shown below.

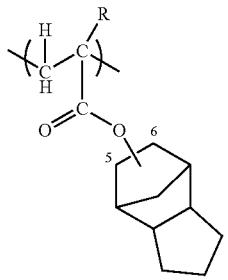
(X)

(In the formula, R represents the same as those described above.)

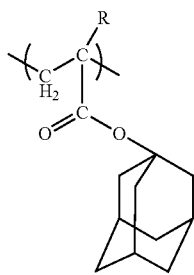
(XI)

(In the formula, R represents the same as those described above.)

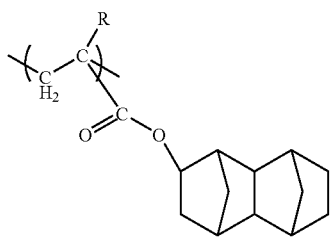
(XII)

(In the formula, R represents the same as those described above.)

If the structural unit (a8) is contained, the proportion of the structural unit (a8) within the (α-lower alkyl) acrylate ester resin component is preferably within a range from 1 to 25 mol %, and more preferably 5 to 20 mol %, relative to the total of all the structural units which constitute the component (A-1').

The (α-lower alkyl) acrylate ester resin component (A-1') is preferably a copolymer containing at least the structural units (a5), (a6) and (a7). Examples of the copolymer include a copolymer composed of the structural units (a5), (a6) and (a7); and a copolymer composed of the structural units (a5), (a6), (a7) and (a8).

The (α-lower alkyl) acrylate ester resin component (A-1') can be prepared by a known radical polymerization of the monomers corresponding with each structural unit, using a radical polymerization initiator such as azobisisobutyronitrile (AIBN).

In the (α-lower alkyl) acrylate ester resin component (A-1'), an acid dissociable, dissolution inhibiting group is dissociated from the structural unit (a5) by an action of an acid generated from the component (B), and thereby a carbonic acid is produced. The produced carbonic acid enables a coating layer having high adhesion to a pattern to be formed.

The mass average molecular weight (a polystyrene equivalent mass average molecular weight determined using gel permeation chromatography (GPC), which is referred to similarly hereinafter) of the (α-lower alkyl) acrylate ester resin component is adjusted to no more than 30,000, preferably no more than 20,000, still more preferably no more than 12,000, and most preferably no more than 10,000.

There are no particular restrictions on the lower limit, and the lower limit is preferably no less than 4,000, and more preferably no less than 5,000, from the viewpoint of inhibiting pattern collapse and improving the resolution.

Component (A-2)

There are no restrictions on the component (A-2), as long as it has a molecular weight of 500 to 2,000, contains hydrophilic groups, and also contains the acid dissociable, dissolution inhibiting group X or X' described above in the component (A-1).

Specific examples thereof include compounds wherein a portion of the hydrogen atoms of the hydroxyl groups within a compound containing a plurality of phenol structures have been substituted with the aforementioned acid dissociable, dissolution inhibiting group X or X'.

Preferable examples of the component (A-2) include compounds wherein a portion of the hydrogen atoms of the hydroxyl groups within the low molecular weight phenol compounds known as sensitizers or heat resistance improvement agents within non-chemically amplified g-line and i-line resists have been substituted with an acid dissociable, dissolution inhibiting group, and any of these compounds can be used.

Examples of these low molecular weight phenol compounds include the following:

Namely, examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4-trihydroxyphenylpropane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course, low molecular weight phenol compounds of the present invention is not limited to these compounds.

There are no particular restrictions on the acid dissociable, dissolution inhibiting group, and suitable examples include the groups described above.

Acid Generator (B)

As the component (B), any of the compounds appropriately selected from conventional acid generators for use within chemically amplified resists can be used.

Specific examples of suitable diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these compounds, onium salts containing a fluorinated alkylsulfonate ion as the anion are preferred.

Examples of suitable oxime sulfonate compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

In the present invention, onium salts and/or a diazomethane-based acid generator are/is preferable. Of these, onium salts containing a fluoroalkylsulfonate ion as an anion and/or bis(alkylsulfonyl)diazomethanes are/is preferable.

As the component (B), either a single acid generator may be used alone, or a combination of two or more different acid generators may be used.

The quantity used of the component (B) is typically within a range from 1 to 20 parts by weight, and preferably from 2 to 10 parts by weight, relative to 100 parts by weight of the component(s) (A-1) and/or (A-2). If this quantity is not less than the lower limit in the above range, then pattern formation progress satisfactorily, whereas if the quantity is not more than the upper limit in the above range, it is easy to achieve a uniform solution, and to obtain excellent storage stability of the composition.

In order to improve the resist pattern shape and the post exposure stability of the latent image formed by the pattern-wise exposure of the resist layer, a nitrogen-containing organic compound can also be added to the resist composition as an optional component (C).

A multitude of these nitrogen-containing organic compounds have already been proposed, and one of these known compounds can be used, although an amine, particularly a secondary lower aliphatic amine or a tertiary lower aliphatic amine is preferred.

Here, a lower aliphatic amine means an alkyl or alkyl alcohol amine of no more than 5 carbon atoms, and examples of these secondary and tertiary amines include tripenthylamine, diethylamine, triethylamine, di-n-propylamine, tri-n-propylamine, tripentylamine, diethanolamine, triethanolamine, and triisopropanolamine. Of these, tertiary alkanolamines such as triethanolamine and triisopropanolamine are particularly preferred.

These may be used either alone, or in combinations of two or more different compounds.

These compounds are typically used in a quantity within a range from 0.01 to 5.0 parts by weight, relative to 100 parts by weight of the component(s) (A-1) and/or (A-2).

Furthermore, in order to prevent any deterioration in sensitivity caused by the addition of the aforementioned component (C), and improve the resist pattern shape and the post exposure stability of the latent image formed by the pattern-wise exposure of the resist layer, an organic carboxylic acid, or a phosphorus oxo acid or derivative thereof can also be added as an optional component (D).

The component (C) and the component (D) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (D) is typically used in a quantity within a range from 0.01 to 5.0 parts by weight, relative to 100 parts by weight of the component(s) (A-1) and/or (A-2).

Other miscible additives can also be added to a resist composition of the present invention according to need, and examples include additive resins for improving the properties of the resist film, surfactants for improving the ease of application, dissolution inhibitors, plasticizers, stabilizers, colorants, and halation prevention agents.

Organic Solvent

A resist composition of the present invention can be produced by dissolving the materials in an organic solvent.

The organic solvent may be any solvent capable of dissolving the various components to generate a uniform solution, and one or more solvents appropriately selected from known materials used as the solvents for conventional chemically amplified resists can be used.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and dipropylene glycol monoacetate, and the monomethyl ether, monoethyl ether, monopropyl ether, monobutyl ether or monophenyl ether thereof; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, and propylene glycol monomethyl ether (PGME) are preferable.

These organic solvents may be used either alone, or as a mixed solvent of two or more different solvents.

There are no particular restrictions on the quantity of the organic solvent, although the quantity should provide a concentration that enables favorable application of the solution to a substrate.

As the resist composition other than those described in the above embodiments, a composition which is a radiation-sensitive composition known as a resist composition and contains an organic compound having hydrophilic groups can be suitably used.

For example, a radiation sensitive composition other than chemically amplified resist compositions, which contains an alkali-soluble resin such as a nobolak resin and hydroxystyrene resin, and a photosensitive component such as a naphthoquinone diazide-containing compound, can be used as a resist composition. Also, a sensitizer can be contained, according to need. As the sensitizer, in the case of using a low molecular weight compound which has molecular weight of no less than 500 and contains a phenolic hydroxyl group, the compound also contributes to the effect as an organic compound which is an essential component in a resist composition.

Organic Film

The organic film used in the present invention is an organic film which is etchable by a conventional etching method, preferably a dry etching method. This organic film is preferably insoluble in an alkali developing solution used in development which is conducted after exposure.

Different from a resist film, an organic film material used for forming an organic film does not necessarily have sensitivity to an electron beam or light. A resist or a resin generally used in the production of semiconductor devices and light crystal display devices may be used as the material.

Also, the organic film preferably contains a material which can be used in etching, particularly dry etching, because the resist pattern 3B coated by the coating layer 5 needs to be transferred to the organic film. Of these, it is preferably a material which can be etched using oxygen plasma etching, as described above.

As this kind of material, it is preferable to use at least one selected from the group consisting of a novolak resin, an acrylic resin and a soluble polyimide as the main component. These materials are easy to be etched using oxygen plasma etching, and also have high resistance against fluorinated gases, therefore they are preferable. Alternatively, they may be materials conventionally used for an underlayer organic antireflection membrane.

Of these, a novolak resin and an acrylic resin having an alicyclic site or an aromatic ring at the side chain are preferably used, because they are inexpensive, generally used, and also have excellent resistance against dry etching using fluorocarbon gases.

As the novolak resin, novolak resins generally used in a positive resist composition, or positive resist compositions for i-line and g-line in which novolak resins are included as the major component can be used.

The novolak resin is obtained, for example, by an addition condensation of an aromatic compound having a phenolic hydroxyl group (hereinafter, simply referred to as a phenol) with an aldehyde, in the presence of an acid catalyst.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethyl ether, pyrogallol, fluoroglycinol, hydroxydiphenyl, bisphenol A, gallic acid, gallate ester, α-naphthol and β-naphthol.

Examples of aldehydes include formaldehyde, furfral, benzaldehyde, nitrobenzaldehyde and acetaldehyde.

The catalyst used in the addition condensation reaction is not specifically limited, and for example, hydrochloric acid, nitric acid, sulfuric acid, formic acid, oxalic acid and acetic acid may be used as the acid catalyst.

The weight average molecular weight of the novolak resin is preferably within a range from 3,000 to 10,000, more preferably from 6,000 to 9,000, and still more preferably from 7,000 to 8,000. When the weight average molecular weight is less than 3,000, the novolak resin may cause sublimation when baked at high temperature. On the other hand, when the weight average molecular weight is more than 10,000, it tends to become impossible to perform dry etching, and therefore it is not preferred.

The novolak resin which can be used in the present invention is commercially available, and is preferably a novolak resin which has a weight average molecular weight within a range from 5,000 to 50,000 and preferably from 8,000 to 30,000, and also has a low molecular weight component of a molecular weight of 500 or less, preferably 200 or less, whose content is 1% or less by weight, preferably 0.8% or less by weight, determined using gel permeation chromatography. The lesser the content of the low molecular weight component, the more preferable. The content is preferably 0% by weight.

The "low molecular weight component of a molecular weight of 500 or less" is detected as a low-molecular fraction having a molecular weight of 500 or less when analyzed by a GPC method using polystyrene standards. The "low molecular weight component of a molecular weight of 500 or less" includes a non-polymerized monomer, and those having low polymerization degree, such as those obtained by condensing 2 to 5 molecules of phenols with aldehydes, although this varies depending on the molecular weight.

The content (% by weight) of the low molecular weight component of a molecular weight of 500 or less is measured by plotting a fraction number (abscissa) versus a concentration (ordinate) of the analysis results obtained by the GPC method to form a graph, and determining ratio (%) of the area under the curve of the low molecular weight component of a molecular weight of 500 or less to the entire area under the curve.

By adjusting Mw of the novolak resin to 50,000 or less, excellent embedding into a substrate having fine irregularity is attained. By adjusting Mw of the novolak resin to 5,000 or more, etching resistance to fluorocarbon gases is obtained, and therefore it is preferred.

When the content of the low molecular weight component having a molecular weight of 500 or less is 1% or less by weight, excellent embedding into a substrate having fine irregularity is attained. The reason is not clear, and is believed to be that the dispersion degree decreases.

As the acrylic resin, there can be used those which are generally used in the positive resist composition. The acrylic resin includes, for example, an acrylic resin including a structural unit derived from a polymerizable compound having an ether bond and a structural unit derived from a polymerizable compound having a carboxyl group.

Examples of the polymerizable compound having an ether bond include (meth)acrylic acid derivatives having an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate and tetrahydrofurfaryl (meth)acrylate. These compounds can be used alone or in combination. In the present description, (meth)acrylate means either or both of acrylate and methacrylate.

Examples of the polymerizable compound having a carboxyl group include monocarboxylic acids such as acrylic acid, methacrylic acid and crotonic acid; dicarboxylic acids such as maleic acid, fumaric acid and itaconic acid; and compounds having a carboxyl group and an ester bond, such as 2-methacryloyloxyethylsuccinic acid, 2-methacryloyloxyethylmaleic acid, 2-methacryloyloxyethylphthalic acid and 2-methacryloyloxyethylhexahydrophthalic acid. Among these compounds, acrylic acid and methacrylic acid are preferable. These compounds can be used alone or in combination of two or more compounds.

The soluble polyimide is a polyimide which can be formed into a liquid by using the organic solvent described above.

An organic film material can be used alone or in combinations of two or more materials.

The organic film, for example, can be formed by applying a solution of an organic film material described above on a substrate according to a conventional method.

As a solvent, an organic solvent used in a resist composition and the like can be used.

In this way, in the present invention, the etching resistance of a pattern can be improved in an etching process using a pattern formed on a substrate as a mask.

Further, a pattern with a high aspect ratio can be formed especially in a process using two or more layers such as a process using an organic film and a resist film as described above.

Furthermore, a pattern coating material of the present invention can be coated under a low-temperature treatment (a coating film may be formed with a heat treatment, or it can be formed without a heat treatment), and is also convenient, therefore the production efficiency can be improved, the cost can be reduced, and the pattern coating material can be applied to a pattern made of various kinds of materials.

Conventionally, a method is proposed where a pattern with a high aspect ratio is formed by the steps of: forming a laminate equipped with a substrate, an underlayer organic film, an interlayer made of a silica coating film, and a resist film, sequentially from the bottom to the top; forming a resist pattern within the resist film; dry-etching the interlayer made of the silica coating film using the pattern as a mask; and then dry-etching the underlayer organic film using the resist pattern and the interlayer made of the silica coating film as a mask.

For example, a silica film used in the above process is manufactured through a high-temperature treatment called as a spin-on-glass (SOG) method. Therefore, in the case that a pattern is coated by a silica film manufactured by the SOG method, the coated pattern causes heat sag, because a high-temperature treatment is required, and thus it is impossible to apply it to a pattern forming method of the present invention. On the other hand, the present invention has a great advantage in this point, because a coating film with excellent etching resistance can be formed easily through a low-temperature treatment.

EXAMPLES

Example 1

First, a solution of a commercially available base material (product name: TBLC-100, manufactured by Tokyo Ohka Kogyo Co., Ltd.) was applied to the surface of an 8-inch silicon wafer using a spinner, and this solution was then soft baked at 230° C. for 90 seconds, thus forming an organic film with a film thickness of 425 nm.

Subsequently, 70 parts by mass of a resin (Mw=8,000) prepared by protecting 25 mol % of the hydroxyl groups of a polyhydroxystyrene with 1-ethoxyethyl groups, 30 parts by mass of a resin (Mw=8,000) prepared by 25 mol % of the hydroxyl groups of a polyhydroxystyrene with tert-butoxycarbonyl groups, 6.5 parts by mass of diazomethane, 0.227 parts by mass of salicylic acid, 0.108 parts by mass of triethanolamine, and 5.42 parts by mass of dimethylacetamide were dissolved in 730 parts by mass of PGMEA, thereby preparing a resist composition.

The resist composition was applied on the organic film by a spin coating method, and prebaked at 90° C. for 90 seconds to form a resist film. Then, the resist film was selectively exposed through a mask using an KrF excimer laser exposure device FPA-3000EX3 (NA=0.6, σ=0.65), manufactured by Canon Inc.

Following the completion of post exposure baking (PEB) for 90 seconds at 110° C., the film was developed for 60 seconds in a 2.38% by weight aqueous solution of tetramethylammonium hydroxide, thus forming a line and space pattern.

The width and height of the resist pattern were measured, and the result was a width of 286 nm and a height of 436 nm.

A cumene solution of silicon tetraisocyanate (Si(NCO)$_4$) [pattern coating material] (concentration: 100 mM) was uniformly applied thereon by a spin coating method, and then it was left at rest for 10 seconds at room temperature (25° C.). Subsequently, the coating film was washed for 15 seconds using cumene.

Further, a hydrolysis reaction is conducted for 15 seconds using deionized water.

A series of the operations from application of the pattern coating material, through washing, to hydrolysis was performed 10 times, thereby a coating layer (silicon oxide film (SiO$_2$)) with film thickness of about 20 nm was obtained.

Subsequently, a pattern on which the coating layer was formed was etched by oxygen plasma etching using a reactive ion etching (RIE) apparatus, RIE-10NR (manufactured by SAMCO Inc.).

In this oxygen plasma etching, the decrease in pattern size values in a longitudinal direction (height) and in a transverse direction (width) were measured, changing treatment time, pressure in the chamber, and output power added to generate plasma (electric power) and keeping flow rate of oxygen gas constant (30 sccm). The results are shown in Tables 1 to 4. In Tables 1 to 4, "the decreased value in film thickness" is shown as "(decreased value in height)/(decreased value in width)." That is, in case of "0/0", it means that the value changed in sizes of height and width are both 0.

Also, the conditions of the pressure and the output power are shown in Tables 1 to 4.

Here, the term "sccm" represents the measured value at 23° C. and 1 atm (atmosphere pressure: 1,013 hPa).

Comparative Example 1

With the exception that the pattern was not coated by a pattern coating material, Comparative Example 1 was performed in the same manner as Example 1.

The width and height of the obtained resist pattern were measured. The resist pattern width was 250 nm and the resist pattern height was 417 nm.

The decrease in pattern size values are shown in Tables 1 to 4.

TABLE 1

Decreased Value in Film Thickness (unit: nm)

| | 5 seconds | 10 seconds | 20 seconds | 30 seconds | 40 seconds | 60 seconds |
|---|---|---|---|---|---|---|
| Example 1 | 0/0 | 0/0 | 0/0 | 0/0 | 0/0 | 0/0 |
| Comparative Example 1 | 20/16 | 72/48 | 231/107 | 415/247 | 417/250 | 417/250 | conditions (pressure: 40 Pa, output power: 300 W)

TABLE 2

Decreased Value in Film Thickness 30 seconds (unit: nm)

| | |
|---|---|
| Example 1 | 0/0 |
| Comparative Example 1 | 72/68 | conditions (pressure: 40 Pa, output power: 100 W)

TABLE 3

Decreased Value in Film Thickness 30 seconds (unit: nm)

| | |
|---|---|
| Example 1 | 0/0 |
| Comparative Example 1 | 179/95 | conditions (pressure: 100 Pa, output power: 300 W)

TABLE 4

Decreased Value in Film Thickness 30 seconds (unit: nm)

| | |
|---|---|
| Example 1 | 0/0 |
| Comparative Example 1 | 302/151 | conditions (pressure: 20 Pa, output power: 300 W)

From the results of Tables 1 to 4, by using the pattern coating material of the present invention, no change in pattern size was observed under any of the conditions, the pattern shape before etching was maintained, therefore it was confirmed that the pattern using the pattern coating material of the present invention had extremely high etching resistance.

INDUSTRIAL APPLICABILITY

The present invention enables etching resistance of a pattern to be improved in an etching process using a pattern formed on a substrate as a mask, therefore it displays favorable industrial applicability.

The invention claimed is:
1. A mask for etching, comprising a pattern coating material in a pattern formed on a laminate which is equipped with a substrate and an organic film, comprising a metal compound (W) which can produce a hydroxyl group on hydrolysis, wherein said metal compound (W) is selected from the group consisting of titanium butoxide, zirconium propoxide, aluminum butoxide, niobium butoxide, silicon tetramethoxide, boron ethoxide, lanthanide isopropoxide, yttrium isopropoxide, barium titanium alkoxide, diethyldiethoxysilane, titanium butoxide tetramer, tetraisocyanate silane, titanium tetraisocyanate, zirconium tetraisocyanate, aluminum triisocyanate, tetrachlorotitanium tetrachlorosilane, cobalt chloride, titanium oxoacetylacetate and iron pentacarbonyl.

2. A pattern forming method, which comprises
forming, a pattern on a laminate which is equipped with a substrate and an organic film;
coating the pattern using a pattern coating material selected from the group consisting of titanium butoxide, zirconium propoxide, aluminum butoxide, niobium butoxide, silicon tetramethoxide, boron ethoxide, lanthanide isopropoxide, yttrium isopropoxide, barium titanium alkoxide, diethyldiethoxysilane, titanium butoxide tetramer, tetraisocyanate silane, titanium tetraisocyanate, zirconium tetraisocyanate, aluminum triisocyanate, tetrachlorotitanium, tetrachlorosilane, cobalt chloride, titanium oxoacetylacetate and iron pentacarbonyl; and
etching the organic film using the coated pattern as a mask.

3. A pattern forming method according to claim 2, wherein the etching is an oxygen plasma etching, or an etching using $CF_4$ gas or $CHF_3$ gas.

4. A pattern forming method, comprising:
forming a pattern on a laminate which is equipped with a substrate and an organic film;
coating the pattern using a pattern coating material which is a compound represented by the general formula (S-1):

$$SiW_a \qquad (S\text{-}1),$$

wherein a represents an integer from 2 to 4, and W represents independently isocyanate group or a halogen atom; and
etching the organic film using the coated pattern as a mask.

5. A pattern forming method according to claim 4, wherein in the formula (S-1), a represents 4 and W represents independently an isocyanate group or a chlorine atom.

6. A pattern forming method according to claim 4, wherein the compound represented by (S-1) is tetraisocyanate silane.

7. A pattern forming method according to claim 4, wherein the compound represented by (S-1) is tetrachlorosilane.

* * * * *

UNITED STATES PATENT AND TRADEMARK OFFICE
CERTIFICATE OF CORRECTION

PATENT NO.      : 7,932,013 B2
APPLICATION NO. : 11/993444
DATED           : April 26, 2011
INVENTOR(S)     : Shogo Matsumaru et al.

It is certified that error appears in the above-identified patent and that said Letters Patent is hereby corrected as shown below:

At Column 4, Line 24, Change "$Et_2Si(O\text{-}Et)_2$);" to --($Et_2Si(O\text{-}Et)_2$);--.

At Column 4, Line 45, Change "($Ti(CO)_4$)," to --($Ti(NCO)_4$),--.

At Column 5, Line 34, Change "carboxy groups" to --carboxyl groups--.

At Column 7, Line 25, Change "μm," to --nm,--.

At Column 16, Line 57, Change "tetrahydrofulranyl" to --tetrahydrofuranyl--.

At Column 17, Line 3, Change "para" to --(para--.

At Column 17, Line 24, Change "$R^{41}$" to --$R^{4'}$--.

At Column 17, Line 27, Change "$R^{41}$" to --$R^{4'}$--.

At Column 19, Line 14 (Approx.), Change "polycylic" to --polycyclic--.

At Column 20, Line 65, Change "group $COOR^4$" to --group -$COOR^4$--.

At Column 23, Line 43, Change "(as)" to --(a5)--.

At Column 23, Line 67, Change "(I)" to --(I')--.

At Column 26, Line 42, Change "(2',3',4" to --(2',3',4'--.

At Column 27, Line 55-56, Change "tripenthylamine," to --trimethylamine,--.

At Column 29, Line 56, Change "furfral," to --furfural,--.

At Column 30, Line 56, Change "tetrahydrofurfaryl" to --tetrahydrofurfuryl--.

At Column 34, Line 24, In Claim 1, change "tetrachlorotitanium" to --tetrachlorotitanium,--.

Signed and Sealed this
Eighteenth Day of October, 2011

David J. Kappos
*Director of the United States Patent and Trademark Office*

At Column 34, Line 27 (Approx.), In Claim 2, change "comprises" to --comprises:--.

At Column 34, Line 28 (Approx.), In Claim 2, change "forming," to --forming--.

At Column 34, Line 56, In Claim 4, after "independently" insert --an--.

UNITED STATES PATENT AND TRADEMARK OFFICE
CERTIFICATE OF CORRECTION

| | | |
|---|---|---|
| PATENT NO. | : 7,932,013 B2 | Page 1 of 1 |
| APPLICATION NO. | : 11/993444 | |
| DATED | : April 26, 2011 | |
| INVENTOR(S) | : Shogo Matsumaru et al. | |

It is certified that error appears in the above-identified patent and that said Letters Patent is hereby corrected as shown below:

Title page, Item (73) after "Tokyo Ohka Kogyo Co., Ltd., Kawasaki-shi (JP)", insert --Riken, Wako-shi, (JP)--.

Signed and Sealed this
Twenty-first Day of February, 2012

David J. Kappos
*Director of the United States Patent and Trademark Office*